United States Patent
Teranishi

(10) Patent No.: US 10,050,416 B2
(45) Date of Patent: Aug. 14, 2018

(54) METHOD OF CONTROLLING VARIABLE OPTICAL ATTENUATOR AND SEMICONDUCTOR OPTICAL AMPLIFIER, AND OPTICAL AMPLIFYING UNIT IMPLEMENTING THE SAME

(71) Applicant: Sumitomo Electric Device Innovations, Inc., Yokohama-shi (JP)

(72) Inventor: Ryota Teranishi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 270 days.

(21) Appl. No.: 15/007,393

(22) Filed: Jan. 27, 2016

(65) Prior Publication Data

US 2016/0141834 A1 May 19, 2016

Related U.S. Application Data

(63) Continuation-in-part of application No. 14/850,698, filed on Sep. 10, 2015.

(30) Foreign Application Priority Data

Sep. 11, 2014 (JP) .................................. 2014-185303
Jan. 30, 2015 (JP) .................................. 2015-017575

(51) Int. Cl.
*H01S 5/50* (2006.01)
*H01S 5/0683* (2006.01)
(Continued)

(52) U.S. Cl.
CPC .............. *H01S 5/50* (2013.01); *H01S 5/0683* (2013.01); *H01S 3/10015* (2013.01);
(Continued)

(58) Field of Classification Search
CPC ........ H01S 5/0014; H01S 5/0683; H01S 5/50; H01S 5/02415; H01S 5/02284;
(Continued)

(56) References Cited

U.S. PATENT DOCUMENTS

2003/0081893 A1* 5/2003 Wing So .............. G02B 6/2931
                                                          385/27
2004/0190846 A1* 9/2004 Nakamura ........ C03B 37/01433
                                                         385/123
(Continued)

FOREIGN PATENT DOCUMENTS

| CN | 101043758 A | 9/2007 |
| JP | 08-248455 A | 9/1996 |
| JP | 09-224016 A | 8/1997 |

OTHER PUBLICATIONS

Non-Final Office Action in U.S. Appl. No. 14/850,698, dated Jun. 1, 2017 [Related application, provided in IFW].

*Primary Examiner* — Thanh Luu
*Assistant Examiner* — Jennifer Bennett
(74) *Attorney, Agent, or Firm* — Venable LLP; Michael A. Sartori; Laura G. Remus

(57) ABSTRACT

A method to control an amplifying unit including a variable optical attenuator VOA and a semiconductor optical amplifier SOA is disclosed. The method first sets the attenuation of the VOA in a value realizable in the VOA and the optical gain of the SOA in a value where the SOA may operate in an optimum range. The method then gradually reduces the attenuation of the VOA as detecting the intensity of the beam output from the amplifying unit. When the intensity is still less than a target one even when the VOA shows no attenuation, the optical gain of the SOA is gradually increased to a value by which the intensity of the output beam becomes the target one.

10 Claims, 9 Drawing Sheets

(51) Int. Cl.
*H01S 5/024* (2006.01)
*H01S 5/022* (2006.01)
*H01S 5/00* (2006.01)
*H01S 3/10* (2006.01)

(52) U.S. Cl.
CPC ........... *H01S 5/005* (2013.01); *H01S 5/02208* (2013.01); *H01S 5/02284* (2013.01); *H01S 5/02415* (2013.01)

(58) Field of Classification Search
CPC .... H01S 5/005; H01S 5/02208; H01S 5/0265; H01S 5/02216; H01S 3/10015; H01S 3/005; H01S 2301/06; H04B 10/2914; G01J 2001/4242
See application file for complete search history.

(56) References Cited

U.S. PATENT DOCUMENTS

| | | | |
|---|---|---|---|
| 2005/0006654 A1* | 1/2005 | Kang | H01S 5/026 257/80 |
| 2005/0025414 A1 | 2/2005 | Kamiyama et al. | |
| 2006/0093362 A1 | 5/2006 | Welch et al. | |
| 2008/0181612 A1* | 7/2008 | Mills | H04J 14/0204 398/83 |
| 2009/0302947 A1 | 12/2009 | Oishi | |
| 2009/0324257 A1 | 12/2009 | Murakami et al. | |
| 2012/0148239 A1 | 6/2012 | Mori et al. | |

* cited by examiner

METHOD OF CONTROLLING VARIABLE OPTICAL ATTENUATOR AND SEMICONDUCTOR OPTICAL AMPLIFIER, AND OPTICAL AMPLIFYING UNIT IMPLEMENTING THE SAME

CROSS REFERENCE TO RELATED APPLICATION

This patent application is a continuation-in-part of pending prior U.S. patent application Ser. No. 14/850,698, filed on Sep. 10, 2015 by Ryota Teranishi titled by OPTICAL AMPLIFYING UNIT AND METHOD TO CONTROL THE SAME, which is hereby incorporated by reference.

BACKGROUND OF THE INVENTION

1. Field of the Invention

The present invention relates to a method to control an optical apparatus that includes a variable optical attenuator (VOA) and a semiconductor optical amplifier (SOA) set in downstream of the VOA.

2. Related Background Arts

An optical communication system sometimes installs an optical apparatus including an SOA between an optical transmitter and an optical receiver. Such an optical apparatus, detecting intensity of an input beam provided from the optical transmitter, adjusts or controls the SOA such that intensity of an output beam amplified by the SOA is set in target intensity, which is often called as the automatic power control (APC). Because the intensity of the input beam temporally varies, the apparatus sometimes attenuates the input beam and then amplifies once attenuated beam to the target intensity by the optical amplifier.

A Japanese patent application laid open No. H08-248455A has disclosed an optical apparatus that includes a front amplifier and a rear amplifier, a VOA put between two amplifiers, a first optical detector for detecting intensity of an amplified beam output from the front amplifier, a second optical detector for detecting intensity of an attenuated beam output from the VOA, and a third detector for detecting intensity of another amplified beam output from the rear amplifier.

The optical apparatus disclosed therein adjusts optical gains of the respective amplifiers and the attenuation of the VOA based on the outputs from the first to third optical detectors. Complex calculations are inevitably required in such an optical apparatus for setting the intensity of the output beam in the target one because respective optical beams each output from the amplifiers and the VOA are detected. Also, the implementation of two or more detectors results in an expanded housing.

SUMMARY OF THE INVENTION

An aspect of the present application relates to a method to control an amplifying unit that includes a variable optical attenuator (VOA) and a semiconductor optical amplifier (SOA). The method includes steps of: setting preset attenuation in the VOA; setting a preset optical gain in the SOA; and setting intensity of a beam amplified by the SOA in target intensity by reducing the attenuation of the VOA. Features of the method of the present application are that (1) the preset attenuation is a maximum attenuation realizable in the VOA, (2) and the preset optical gain is the gain by which the SOA is operable in an optimum range.

Another aspect of the present application relates to an optical amplifying unit that comprises a variable optical attenuator (VOA), a semiconductor optical amplifier (SOA), and a controller. The VOA receives the input beam and outputs an attenuated beam. The SOA receives the attenuated beam and outputs an amplified beam. The controller may set a preset attenuation in the VOA, by which the VOA outputs the attenuated beam with substantially no intensity, and set a preset optical gain in the SOA, by which the SOA may be operable in an optimum range. The controller, after providing the input beam to the VOA, reduces the attenuation of the VOA and adjusts the optical gain of the SOA so as to set target intensity in the amplified beam.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiments of the present application will be described as referring to drawings. In the description of the drawings, numerals or symbols same with or similar to each other will refer to elements same with or similar to each other without duplicating explanations.

First Embodiment

Figure 1:
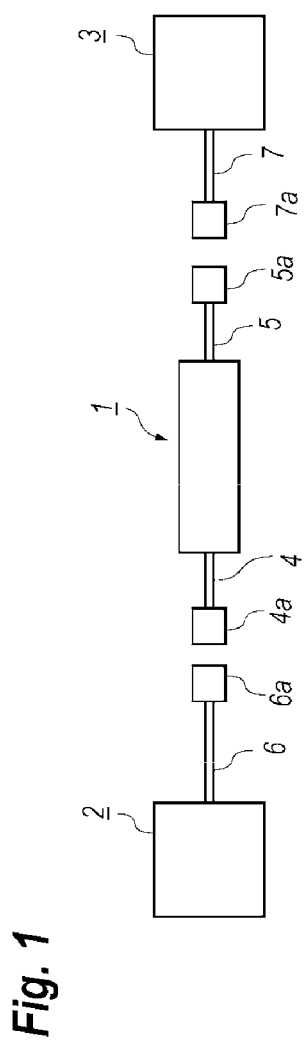
FIG. 1 schematically illustrates an optical system implementing an optical module of the present application.

FIG. 1 schematically illustrates an exemplary application of an optical amplifying unit 1 according to the first embodiment. The optical amplifying unit 1, which is interposed between an optical transmitter 2 and an optical receiver 3, provides an optical fiber 4 accompanying with an optical connector 4a and another optical fiber 5 with another optical connector 5a. The former optical connector 4a is to be mated with an optical connector 6a attached to an optical fiber extending from the optical transmitter 2, while, the latter optical connector 5a is to be mated with an optical connector 7 attached to an optical fiber 7 extending from the optical receiver 3. The optical amplifying unit 1 may receive an optical signal output from the optical transmitter 2 and provided through the optical fibers, 4 and 6; and provide amplified optical signal to the optical receiver 3 through the optical fibers, 5 and 7.

Figure 2:
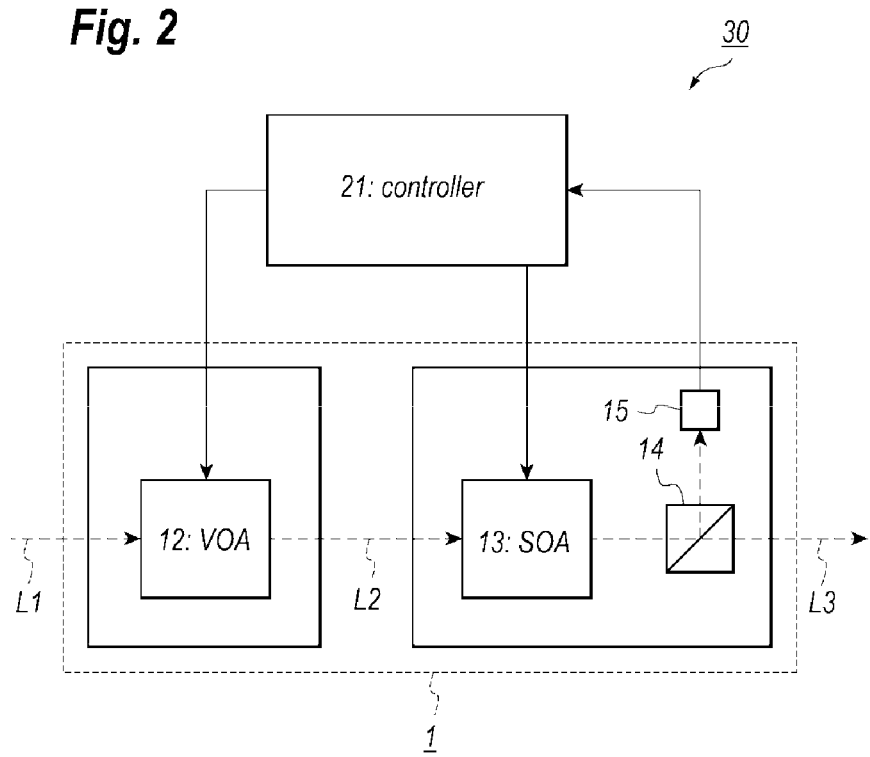
FIG. 2 shows a functional block diagram of the optical module.

FIG. 2 schematically illustrates a functional block diagram of the optical apparatus 30. The optical apparatus 30 includes the optical amplifying unit 1 that includes a semiconductor optical amplifier (SOA) 13, a variable optical attenuator (VOA) 12, an optical splitter 14, and an optical detector 15. The VOA 12 receives an INPUT BEAM L1, which comes from the optical transmitter 2, and outputs an attenuated beam L2. The SOA 13 receives the attenuated beam L2 and externally outputs an amplified beam L3 through the optical splitter 14.

The VOA 12, which may attenuate the input beam L1 by absorbing a portion thereof, includes a semiconductor stack on a semiconductor substrate, where the semiconductor stack includes, for instance, a lower cladding layer, an attenuating layer, an upper cladding layer, and a contact layer. The contact layer provides an electrode on a top thereof for supplying a bias to the attenuating layer. The attenuating layer may include a multiple quantum well (MQW) structure. The attenuation layer varies absorption co-efficient thereof depending on an electric field induced therein formed by the bias supplied to the electrode. Specifically, when the upper and lower cladding layers above described have respective conduction types different from others and the attenuation layer is negatively biased, a strong electric filed is induced in the attenuation layer, which modify the energy bandgap and varies the absorption co-efficient thereof. Accordingly, the VOA 12 may show a function of the variable optical attenuation depending on the bias applied to the electrode.

The SOA 13 may also include a semiconductor stack on the semiconductor substrate common to the semiconductor substrate for the VOA 12, where the semiconductor stack of the SOA may include a lower cladding layer, an amplifying layer, a upper cladding layer, the contact layer, and an electrode. The amplifying layer may have the MQW structure but may have material different from materials of the MQW in the VOA 12. The contact layer in the SOA 13 is physically isolated from the contact layer of the VOA 12 by interposing a passivation layer therebetween. The passivation layer may be made of insulating material including silicon oxide. The upper and lower cladding layers also have conduction types different from each other so as to from a p-i-n junction therein and the amplifying layer of the intrinsic type is positively biased, the amplifying layer may show an optical gain.

A controller 21 also shown in FIG. 2 controls the VOA 12 and the SOA 13. For instance, the controller 21 sets the attenuation of the VOA 12 in a preset value which is, for instance, a maximum attenuation realizable in the VOA 12. The controller 21, depending on the intensity of the amplified beam L3 detected by the optical detector 15, reduces the attenuation of the VOA 12 from the maximum attenuation. The control of the VOA 12 so as to reduce the attenuation thereof is carried out after the setting of the optical gain of the optical amplifier 13. That is, the controller 21 sets the optical gain of the SOA 13 in a value at which the SOA 13 shows stable amplification. Specifically, the optical gain of the SOA 13 is set to be 15 dB at most under the control of the controller 21.

Also, the controller 21, depending on the intensity of the output beam L3 detected by the optical detector 15, adjusts the optical gain of the SOA 13 from the preset gain described above. Specifically, the preset gain of the SOA 13 is set to be 5 to 15 dB. Moreover, even when the preset gain is set to be 15 dB, the controller may increase the optical gain in a range of 16 to 20 dB when the intensity of the amplified beam L3 becomes insufficient. The control of the optical gain may be carried out after the control of the VOA 12.

The controller 21 may set the intensity of the amplified beam L3 in target intensity by the control of the VOA 12 and the SOA 13 thus described. The target intensity depends on, or may be determined according to the input sensitivity of the optical receiver 3 shown in FIG. 1.

Figure 3:
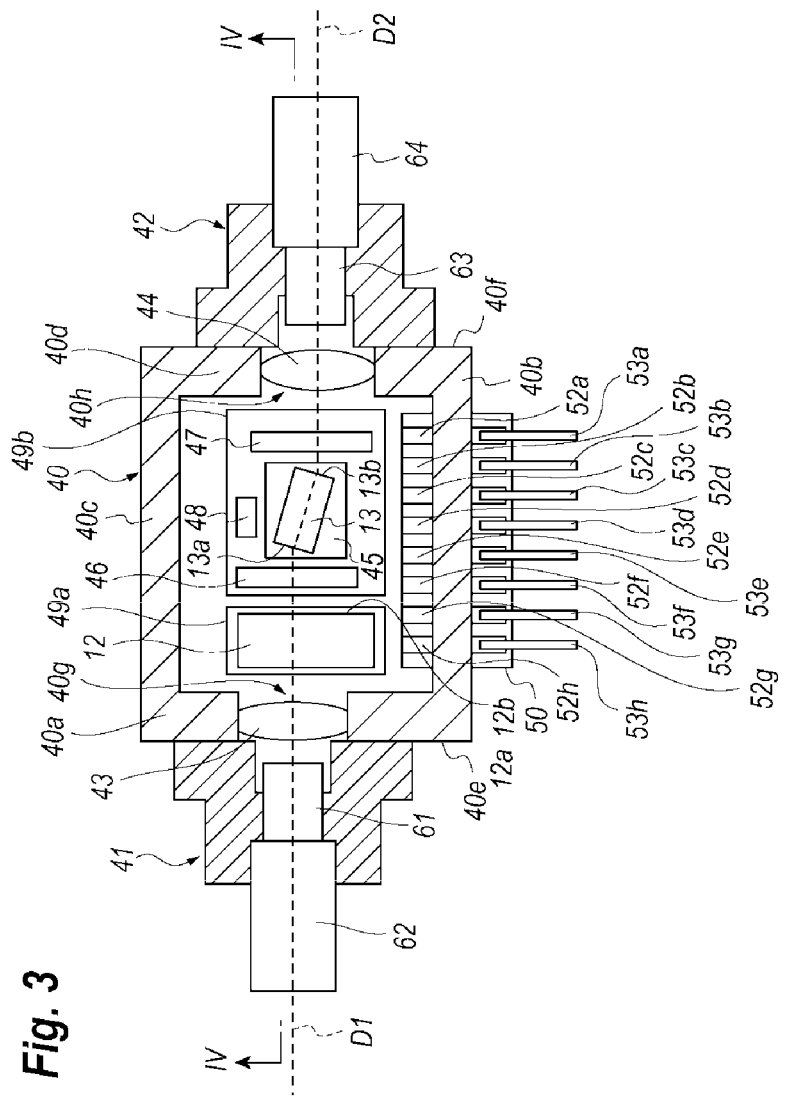
FIG. 3 is a plan view showing an inside of the optical module.
Figure 4:
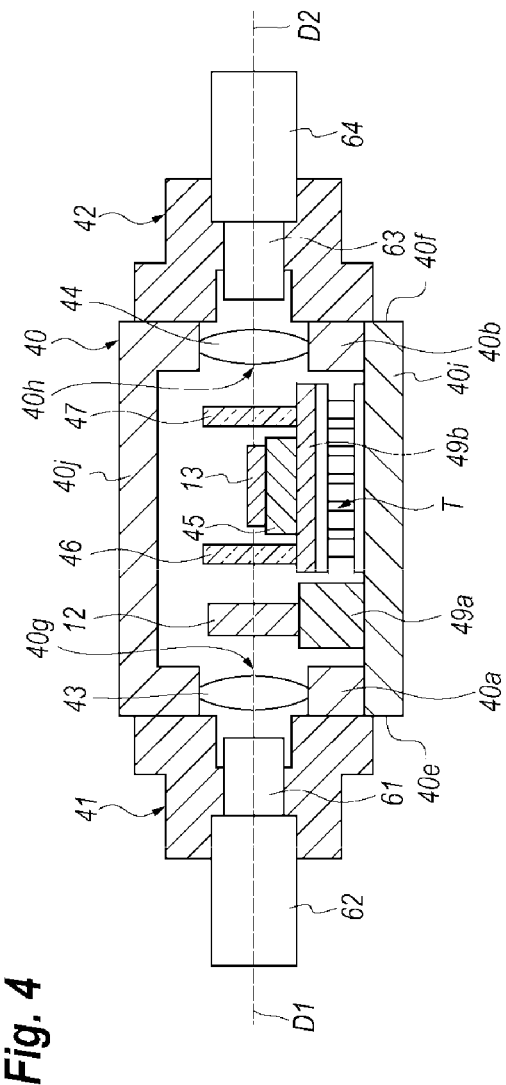
FIG. 4 shows a cross section of the optical module taken along the line appearing in FIG. 3.

Next, details of the optical amplifying unit 1 according to an embodiment will be described as referring to FIGS. 3 and 4. FIG. 3 is a plan view showing an inside of the optical amplifying unit 1 and FIG. 4 shows a cross section taken along the line IV-IV indicated in FIG. 3. The optical amplifying unit 1 of the preset invention includes a housing 40 that encloses the VOA 12 and the SOA 13, a front coupling unit 41, and a rear coupling unit 42.

The housing 40, which has a box shape including sides, 40a and 40b, opposite to each other, and other sides, 40c and 40d, also opposite to each other and connecting former two sides, 40a and 40b, respectively. Thus, four sides, 40a to 40d, form the box shape housing 40. The housing 40 further provides a bottom 40i and a ceiling 40j. The housing 40 except for the bottom 40i may be made of, for instance, alloy containing iron (Fe), nickel (Ni), and cobalt (Co), which is often called as Kovar. The bottom 40i may be made of alloy containing tungsten (W), for instance, copper-tungsten (CuW). The side 40a includes a front surface 40e to which the front coupling portion 41 is assembled. The side 40a also provides a front opening 40g into which a front lens 43 is fitted. The front optical axis D1 extending from the SOA 13 passes the front lens 43 in the front opening 40g. The rear side 40b includes a rear surface 40f that provides a rear opening 40h into which a rear lens 44 is fitted. The rear optical axis D2 also extending from the SOA 13 passes the rear lens 44 in the rear opening 40h. The rear optical axis D2 is offset from the front optical axis D1 because the SOA 13 is placed in diagonal to the optical axes, D1 and D2. That is, the optical axes, D1 and D2, are inclined from respective normal of the front and rear facets, 13a and 13b, of the SOA 13, respectively.

The housing 40 encloses, in addition to the VOA 12 and the SOA 13, a sub-carrier 45, collimating lenses, 46 and 47, a thermistor 48, carriers, 49a and 49b, and a thermo-electric cooler (TEC) T. The TEC T mounts the sub-carrier 45, on which the SOA 13 is mounted, the front and rear collimating lenses, 46 and 47, and the thermistor 48 through the carrier 49b.

The VOA 12 is physically independent of the SOA 13 and put between the front lens 43 and the front collimating lens 46. That is, the rear facet 12b of the VOA 12 optically couples with the front collimating lens 46. The VOA 12 is mounted on the bottom 40i of the housing through the carrier 49a.

The SOA 12 is mounted between the front and rear collimating lenses, 46 and 47, and provides a front facet 13a and a rear facet 13b. The front facet 13a optically couples with the front coupling portion 41 through the front collimating lens 46, and the VOA 12, while, the rear facet 13b optically couples with the rear coupling portion 42 through the rear collimating lens 47. As described, the front and rear facets, 13a and 13b, of the SOA 13 make a substantial angle with respect to the optical axes, D1 and D2, to suppress light entering and being reflected thereat from returning the front coupling portion 41 and light output from the rear facet 13b of the SOA 13 from retuning the SOA 13.

The sub-carrier 45 that mounts the SOA 13 thereon, may be made of, for instance, aluminum nitride (AlN). The carrier 49b mounts the sub-carrier 45, the front and rear collimating lenses, 46 and 47, and the thermistor 48. The TEC T may be a Peltier device. The thermistor 48 may indirectly sense a temperature of the SOA 13 through a temperature of a top of the carrier 49b. Accordingly, the thermistor 48 is preferably positioned as close as possible to the SOA 13.

The side 40d provides a terminal 50 on which a plurality of interconnections, 52a to 52h, are formed. The interconnections, 52a to 52h, are electrically connected to the TEC T, the VOA 12, the SOA 13, and the thermistor 48. The terminal 50 also provides a plurality of lead pins, 53a to 53h, each connected to the interconnections, 52a to 52h. Referring to FIG. 3, some of the lead pins, 53a to 53h, carry control signals for VOA 12 and the SOA 13. The VOA 12, the SOA 13, and the thermistor 48 are connected external through respective lead pins, 53a to 53h. The terminal 50 may be made of ceramics, while, the interconnections, 52a to 52h, may be made of metal primarily containing gold (Au).

The front coupling portion 41, which may be made of stainless steel and welded to the front surface 40e of the housing 40, passes the front optical axis D1 extending from the front facet of the SOA 13. The front coupling portion 41 may be an optical receptacle that pluggably receives an optical ferrule attached in a tip of an external optical fiber with which the VOA 12 optically couples. The front coupling portion 41 includes a stub 61 and an optical cable 62 that secures the external optical fiber. The stub 61 optically couples with the front lens through the VOA 12. The stub 61, which is an optical component that aligns the external optical fiber in the optical cable 62 optically with the front lens 43, may be made of ceramics.

The rear coupling portion 42, which has a cylindrical shape with a center coinciding with the rear optical axis D2, is welded to the rear surface 40f of the housing 40. The rear coupling portion 42 passes the rear optical axis D2 extending from the rear facet 13b of the SOA 13. The rear coupling portion 42 includes another stub 63 to which the other external optical fiber is coupled.

Figure 5:
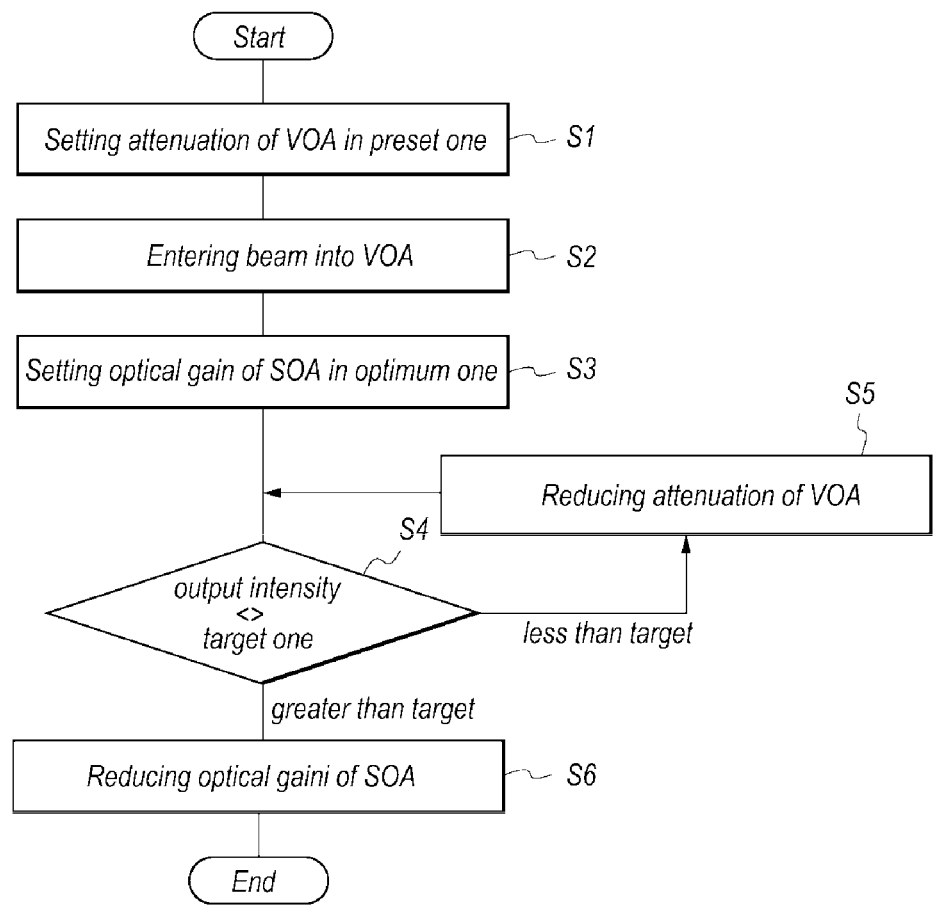
FIG. 5 is a flow chart to operate the optical module, which is according to the first embodiment of the present invention.

Next, a method to operate the amplifying unit 1 according to an embodiment of the present application will be described as referring to FIG. 5, which is a flow chart of the method of operating the amplifying unit 1.

First, the controller 21 performs the first step S1 by which the VOA 12 in the attenuation thereof is set in a preset value by, for instance, supplying a bias to the VOA 12. In this step S1, the attenuation of the VOA 12 is set in a maximum realizable in the VOA 12 and the bias supplied thereto is a reverse bias for the attenuation layer. Also, the SOA 13 in the optical gain thereof is preferably set to be substantially zero. Accordingly, a combination of the preset attenuation for the VOA 12 and the preset gain for the SOA 13 set in step S1 is preferably in respective amounts by which the amplified beam L3 becomes the intensity unable to be detected by the optical detector 15. Under such a condition for the SOA 13, no current flows in the SOA 13 so as not to generate any amplified spontaneous emission (ASE).

The process then provides the INPUT BEAM L1 with substantial intensity to the VOA 12 at step S2. Because the VOA in the attenuation thereof 12 is set maximum in step S1, all of the INPUT BEAM L1, or at least a most portion of the INPUT BEAM L1 is absorbed or cut by the VOA 12.

Figure 6:
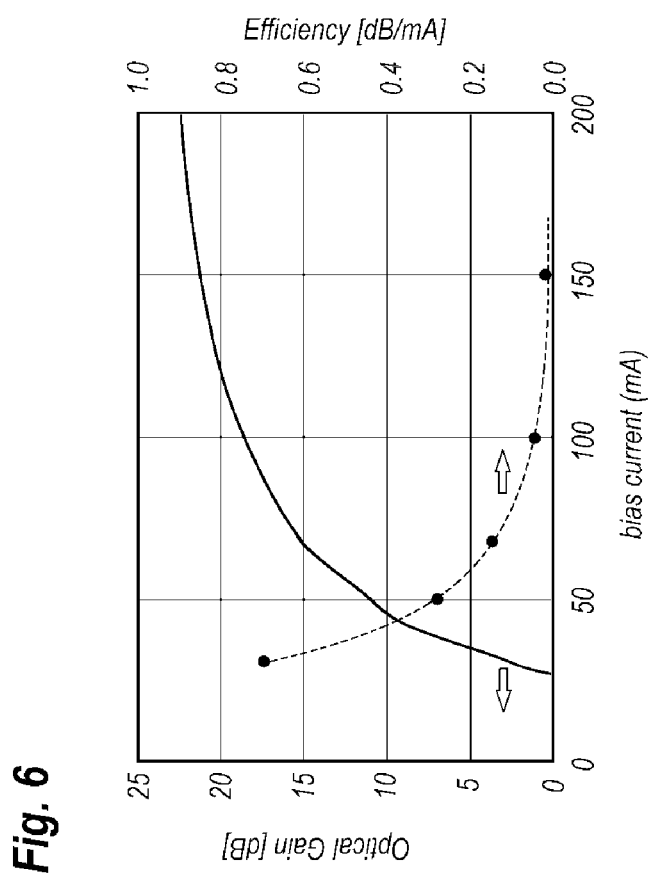
FIG. 6 shows a typical relation between the bias current supplied to an optical amplifier in the optical module and an optical gain of the optical amplifier.

The thirst step sets the optical gain of the SOA 12 in the preset gain at step S3. For instance, supplying a bias current to the SOA 13 in a preset range, the controller 21 sets the optical gain of the SOA 13. FIG. 6 shows an example of the relation of the bias current supplied to the SOA 13, which is shown in the horizontal axis, the optical intensity of an amplified beam output from the SOA 13 corresponding to the left vertical axis, and the efficiency of the optical gain in the right vertical axis, when the SOA 13 receives an INPUT BEAM with a constant intensity. The efficiency may be determined by a ratio of the optical gain against the bias current, that is, the slope of the relation between the optical gain and the bias current, which may be ordinarily obtained at the optical gain of 0 dB. In the exampled shown in FIG. 6, the maximum efficiency is about 0.7 [dB/mA] at the optical gain of 0 dB. According to FIG. 6, setting the bias current in a range 30 to 70 mA, the SOA 13 inherently shows the optical gain of 5 to 15 dB, which corresponds to the efficiency of 80 to 20% of the maximum efficiency.

Then, the process checks whether the intensity of the amplified beam L3 exceeds the target intensity or not at step S4. When the intensity is less than the target one, the controller 21 reduces the attenuation of the VOA 12 based on the detection by the optical detector 15 at step S5. Iterating steps S4 and S5, the intensity of the amplified beam L3 reaches the target intensity.

On the other hand, when the intensity of the amplified beam L3 exceeds the target intensity at step S4, the controller 21 adjusts the optical gain of the SOA 13 at step S6, that is, the controller reduces the optical gain of the SOA 13 as detecting the intensity of the amplified beam L3 by the optical detector 15. The control of the optical gain of the SOA 13 is, what is called, the automatic power control APC.

Figure 7:
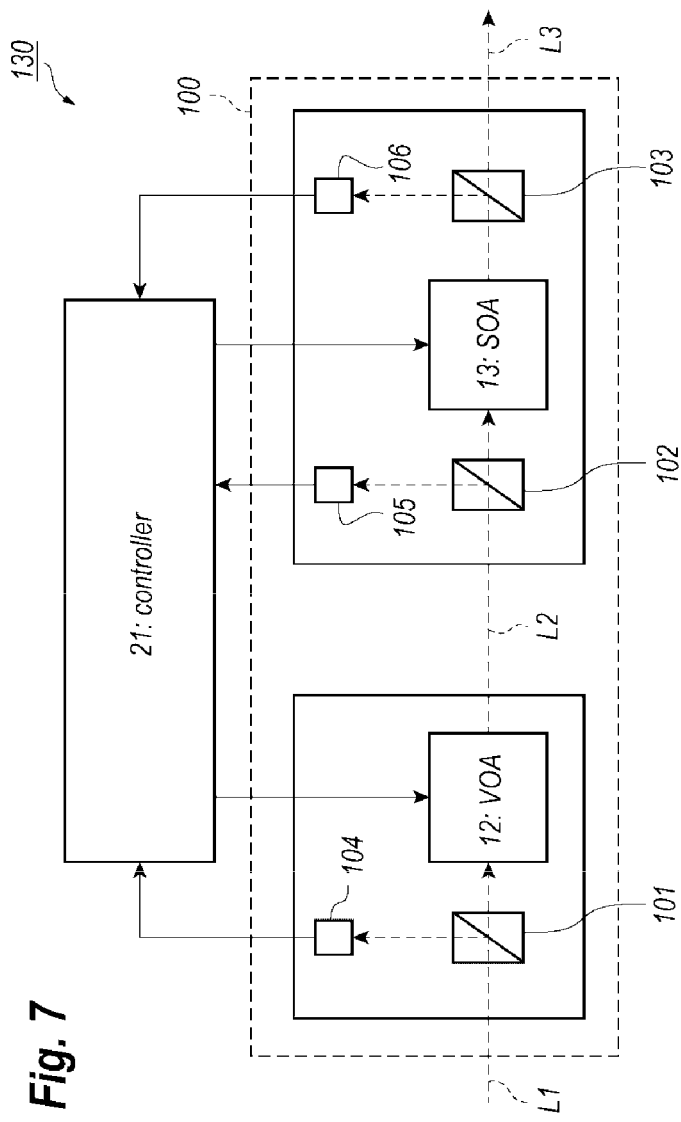
FIG. 7 shows a functional block diagram of another optical module comparative to the optical module of the present invention.

Advantages of the optical apparatus 30 will be described as comparing the apparatus 30 with a conventional arrangement. FIG. 7 is a functional block diagram of an optical apparatus comparable to the optical apparatus shown in FIG. 2. An amplifying unit 100 involved in the optical apparatus 130 also includes a VOA 12 and an SOA 13, where they are physically independent of each other. The optical apparatus 130 further includes optical splitters, 101 to 103, and photodiodes (PDs), 104 to 106, as optical detectors. The first PD detects 104 detects intensity of the input beam L1 split by the optical splitter 101. The second PD 105 detects intensity of the attenuated beam L2 split by the second splitter 102. The third PD 106 detects intensity of the amplified beam L3 split by the third optical splitter 103. The controller 21, based on the outputs from the PDs, 104 to 106, controls the attenuation of the VOA 12 and the optical gain of the SOA 13. The arrangement shown in FIG. 7, similar to the arrangement shown in FIG. 2 of the present invention, may set the intensity of the amplified beam L3 in the target one, but includes additional optical components of two PDs, 104 and 105, and two optical splitters, 101 and 102, which results in an enlarged housing. Also, the controller 21 is necessary to process complex procedures using three outputs of the PDs, 104 to 106.

On the other hand, the arrangement and the procedure according to the present invention, the optical apparatus 30 may easily set the intensity of the amplified beam L3 in the target one by adjusting the attenuation of the VOA 12 and the optical gain of the SOA 13 even when the optical apparatus 30 omits the first optical splitter 101 and the first PD 104 in the comparable example shown in FIG. 7. That is, the optical apparatus 30 may adjust the intensity of the amplified beam L3 only by optical splitter 14 and the optical detector 15.

When the attenuation of the VOA 12 is first set in a maximum value realizable in the VOA 12 at step S1; the optical detector 15 does not sense any optical beam, which may prohibit the controller 21 to begin the process for controlling the optical apparatus 30. The INPUT BEAM L1 may be provided to the VOA 12 after the VOA 12 in the attenuation thereof is set in the maximum at step S1, which may effectively prevent the attenuated beam from entering the SOA 13 during the adjustment of the optical gain thereof. Thus, a status where an amplified beam with excessive intensity is provided to the external optical receiver 3 may be effectively prevented.

Also, the input beam L1 may be provided after step S1 but before step S2. This sequence effectively prevents the beam L2 not attenuated by the VOA 12 from entering the SOA 13 during the adjustment of the optical gain of the SOA 13, which also prevents the amplifying unit 1 from providing an amplified beam with substantial intensity. The attenuation set by the VOA 12 at step 1 may be maximum attenuation realizable in the VOA 12, which provides substantially no beam from the VOA 12.

The method to control the optical apparatus 30 according to the first embodiment, similar to the method of the second embodiment described below, comprises the step S1 to set the attenuation of the VOA 12 in a substantial value, preferably a maximum attenuation realizable in the VOA 12; the step S3 to set the optical gain of the SOA 13 in a value by which the SOA 13 may operable in an optimum range; the step S5 to reduce the attenuation of the VOA 12, according to the detection by the optical detector 15, so as to set the intensity of the amplified beam L3 output from the amplifying unit 1 in the target intensity; and the step S4 to increase the optical gain of the SOA 13 when the attenuation of the VOA 12 becomes zero, namely, no attenuation is done in the VOA 12, but the intensity of the amplified beam L3 is still less than the target one. Thus, the amplifying unit 1 may output the beam L3 with the target intensity.

Second Embodiment

Next, another method of controlling the amplifying unit 1 according to the second embodiment of the present application will be described.

Figure 8:
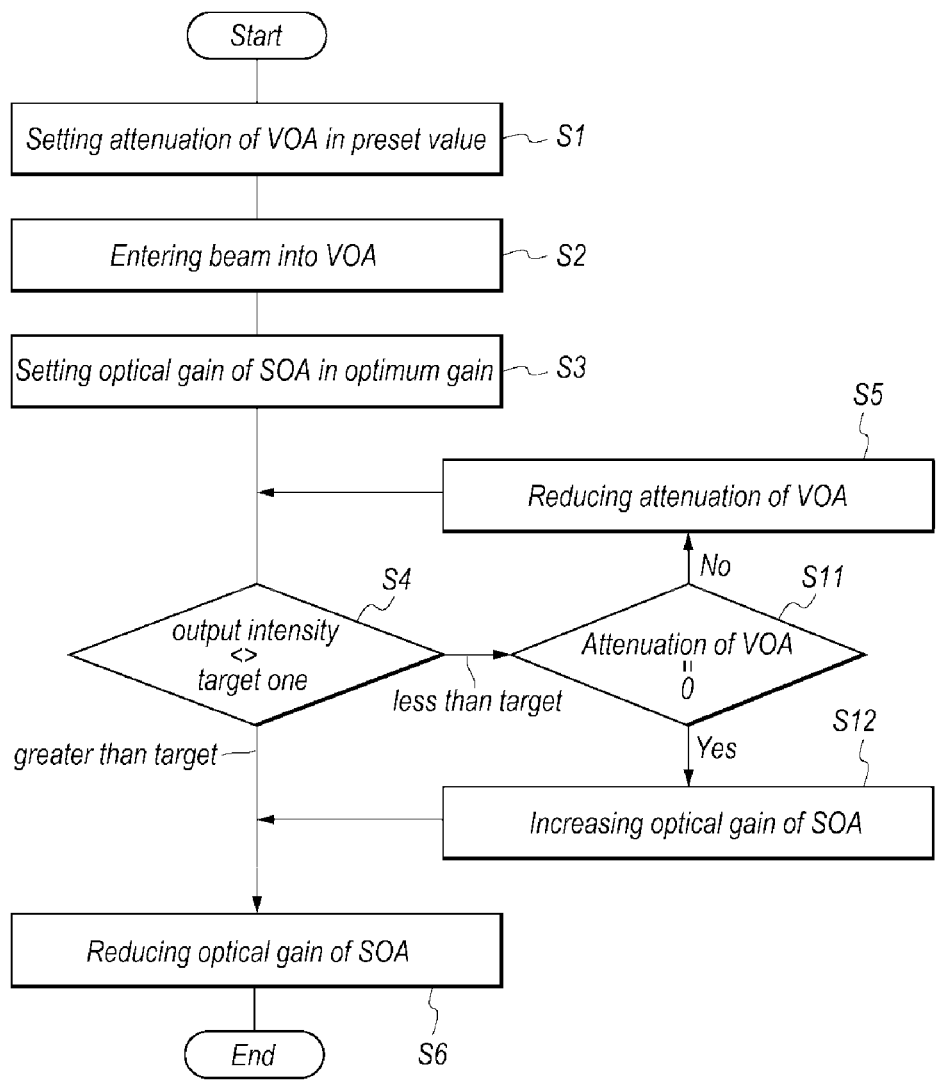
FIG. 8 is a flow chart to operate the optical module, which is according to the second embodiment.

FIG. 8 shows a flow chart of the method according to the second embodiment. The second embodiment checks after step S4 whether the VOA 12 is set in an attenuating state or not when the intensity of the amplified beam L3 output from the SOA 13 is less than the target one, where the attenuating state of the VOA 12 means that the VOA 12 practically attenuates the input beam L1, that is, the intensity of the attenuated beam L2 is less than that of the input beam L1. When the VOA 12 practically attenuates the input beam L1, which is the case of "YES" at step S11, the process performs the step S5 to reduce the attenuation of the VOA 12 then checks the intensity of the amplified beam L3 at step S4.

When the VOA 12 does not attenuate the input beam L1, that is, the attenuation of the VOA 12 is zero, which corresponds to "NO" at step 11, the process increases the optical gain of the SOA 13 from the preset value at step S12 as detecting the intensity of the amplified beam by the optical detector 15. When the optical gain of the SOA 13 is necessary to be decreased, the process performs step S6.

The method thus described according to the second embodiment show advantages similar to those attained in the first embodiment. Also, when the intensity of the amplified beam L3 becomes less than the target one at step S12 nevertheless the VOA 12 is set in a state of no attenuation, the intensity of the amplified beam L3 may be set close to or equal to the target one by setting the optical gain of the SOA 13 exceeds the preset gain set in step S3.

The intensity of the amplifier beam L3 may be detected by a photodiode (PD), which is not shown in figures, implemented within the optical receiver 3. In such an arrangement, the controller 21 may adjust the optical gain of the SOA 13 and the attenuation of the VOA 12 based on the output of the PD in the optical receiver 3 even when the optical apparatus 30 omits the optical detector 15.

The table below shows an example of the control according to steps, S1 to S6, S11, and S12. The table shows the intensity Pin of the input beam L1, the attenuation ATT of the VOA 12, the optical gain G of the SOA 13, and the intensity Pout of the amplifier beam L3, where the control was carried out so as to maintain the intensity Pout of the amplified beam L3 in the target one, which is −5 dBm in the present example. The maximum attenuation realizable in the VOA 12 was −30 dB. The optional optical gain set in step S3 was 15 dB for the SOA 13, and the maximum optical gain able to be set in the SOA 13 was 20 dB.

TABLE I

| case | Pin (dBm) | ATT(dB) | Gain(dB) | Pout(dBm) |
|------|-----------|---------|----------|-----------|
| a | −25 | 0 | 20 | −5 |
| b | −20 | 0 | 15 | −5 |
| c | −15 | −5 | 15 | −5 |
| d | −10 | −10 | 15 | −5 |
| e | −5 | −15 | 15 | −5 |
| f | 0 | −20 | 15 | −5 |
| g | 5 | −25 | 15 | −5 |
| h | 10 | −30 | 15 | −5 |

Figure 9:
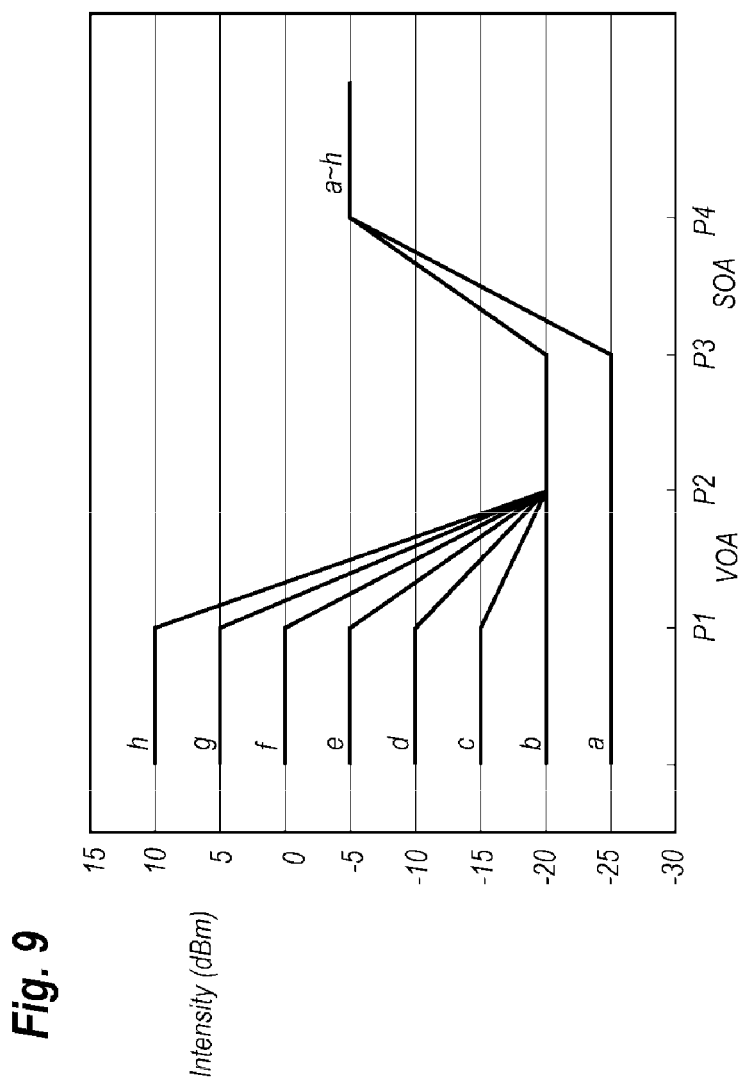
FIG. 9 shows behaviors of optical intensity output from the variable optical attenuator (VOA) and the semiconductor optical amplifier (SOA).

FIG. 9 shows behaviors of the intensity of respective beams, L1 to L3, passing through the amplifying unit 1. In FIG. 8, the vertical axis shows the intensity of the optical beams, and the horizontal axis shows the positions, where a region between P1 and P2 corresponds to the VOA 12 and another region between P3 and P4 is the SOA 13. The INPUT BEAM L1 enters the VOA 12 at the position P1, and the attenuated beam L2 is output at the position P2 and enters the SOA 13 at the position P3. The amplified beam L3 is output at the positon P4. Behaviors "a" to "h" correspond to the cases a to h listed in table 1.

For instance, the behavior h in FIG. 9 enters the VOA 12 with the intensity of 10 dBm, and is attenuated to −20 dBm by the VOA 12. Referring to FIGS. 5 and 7, because the SOA 13 is set in the optical gain thereof to be 15 dB, the amplified beam L3 for the behavior h has the intensity of −5 dBm, which is the target intensity for the amplifying unit 1.

As for the behavior d, which enters the VOA 12 by the intensity of −10 dBm, the VOA 12 attenuates this beam d to −40 dBm at step S3 because the maximum attenuation realizable in the SOA 12 is −30 dB. The SOA 13, whose optical gain is set in 15 dB at step S3, may output the amplified beam for the behavior d with the intensity of −25 dBm, which is smaller than the target intensity requested to the amplifying unit 1. In such a case, the step S5 reduces the attenuation of the VOA 12 to −10 dB, then, the SOA 13 may output the amplified beam L3 with the target intensity of −5 dBm.

As for the behavior a, which has the intensity of −25 dBm, the VOA 12 may attenuate this input beam L1 to −55 dBm at step S3 because the VOA 12 is once set in the maximum attenuation of −30 dB realizable in the VOA 12. In such a case, when the SOA 13 in the optical gain thereof is set to be 15 dB at step S4, the SOA 13 may output the amplified beam L3 with the intensity of −40 dBm, which is far less than the target intensity. The controller 21 then reduces the attenuation of the VOA 12 to 0 dB as monitoring the intensity of the amplified beam L3. Even when the VOA 12 is set in no attenuation state, namely, the attenuation of 0 dB, the SOA 12 may output the amplified beam L3 only with the −10 dB. Then, the controller 21 may increase the optical gain of the SOA 13 to 20 dB at step S12, and the amplifying unit 1 may output the amplified beam L3 with the target intensity of −5 dBm.

While particular embodiments of the present invention have been described herein for purposes of illustration, many modifications and changes will become apparent to those skilled in the art. For instance, although the embodiments perform the steps S1 and S2 sequentially, these steps, S1 and S2, may be carried out concurrently. Also, the attenuation of the VOA 12 set in step S1 is assumed to be that realizable in the VOA 12. However, this attenuation is unnecessary to be that realizable in the VOAS 12. The attenuation first set in the VOA 12 may be, at least equal to the realizable value, or a value for the SOA 13 to be operable in an optimum region. Also, the VOA 12 may be controlled in a temperature thereof by being assembled on, for instance, an additional TEC may mount the VOA 12 through carrier 49*a* thereon. Accordingly, the appended claims are intended to encompass all such modifications and changes as fall within the true spirit and scope of this invention.

I claim:

1. A method of controlling a variable optical attenuator (VOA) and a semiconductor optical amplifier (SOA) implemented in an amplifier unit, the method comprising steps of:
   setting preset attenuation in the VOA, the preset attenuation being maximum attenuation realizable in the VOA;
   setting a preset optical gain in the SOA by supplying an amplifier bias current to the SOA such that the SOA is operable in an optimum range around the preset optical gain, the preset optical gain being set in a range from 20 to 80% of a maximum efficiency of the optical gain against a bias current for the SOA at the optical gain of 0 dB; and
   setting intensity of a beam entering the amplifier unit and amplified by the SOA in target intensity by reducing the attenuation of the VOA.

2. The method of claim 1,
   wherein the step of setting the intensity includes a step of detecting the intensity of the beam amplified by the SOA.

3. The method of claim 1,
   further including a step of increasing the optical gain of the SOA when the intensity of the beam amplified by the SOA is still less than the target intensity even when the VOA is set in a state of no attenuation.

4. The method of claim 1,
   wherein the step of setting the preset attenuation includes a step of setting attenuation by which the VOA passes substantially no optical beam.

5. The method of claim 1,
   further including a step of providing an input beam to the VOA after the step of setting the preset attenuation in the VOA but before the step of setting the preset optical gain in the SOA.

6. An optical amplifying unit that receives an input beam and outputs an amplified beam, comprising:
   a variable optical attenuator (VOA) that receives the input beam and outputs an attenuated beam;
   a semiconductor optical amplifier (SOA) that receives the attenuated beam and outputs the amplified beam; and
   a controller that sets a preset attenuation in the VOA where the VOA outputs the attenuated beam with substantially no intensity and a preset optical gain in the SOA where the SOA is operable in an optimum range,
   wherein the present optical gain of the SOA corresponds to 20 to 80% of a maximum efficiency of the optical gain against a bias current supplied to the SOA at the optical gain of 0 dB.

7. The optical amplifying unit of claim 6,
   wherein the VOA and the SOA are integrally formed on a common semiconductor substrate.

8. The optical amplifying unit of claim 6,
   wherein the VOA is reversely biased and the SOA is positively biased.

9. The optical amplifying unit of claim 6,
   further including an optical detector that detects intensity of the amplified beam,
   wherein the controller controls the attenuation of the VOA and the optical gain of the SOA by receiving only the intensity of the amplified beam.

10. The optical amplifying unit of claim 6,
    wherein the preset attenuation of the VOA set by the controller is a maximum attenuation realizable in the VOA.

* * * * *